(12) United States Patent
Shin et al.

(10) Patent No.: US 11,067,515 B2
(45) Date of Patent: Jul. 20, 2021

(54) APPARATUS AND METHOD FOR INSPECTING A WAFER PROCESS CHAMBER

(71) Applicant: Taiwan Semiconductor Manufacturing Co., Ltd., Hsinchu (TW)

(72) Inventors: Stanley Shin, New Taipei (TW); Kai-Hsiang Chang, New Taipei (TW); Sheng Cho Lin, Taoyuan (TW); Keith Kuang-Kuo Koai, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 236 days.

(21) Appl. No.: 15/904,075

(22) Filed: Feb. 23, 2018

(65) Prior Publication Data
US 2019/0162675 A1    May 30, 2019

Related U.S. Application Data

(60) Provisional application No. 62/591,472, filed on Nov. 28, 2017.

(51) Int. Cl.
*G01N 21/95* (2006.01)
*H01L 21/67* (2006.01)
*G05B 23/02* (2006.01)

(52) U.S. Cl.
CPC ......... *G01N 21/95* (2013.01); *G05B 23/0283* (2013.01); *H01L 21/6719* (2013.01); *H01L 21/67253* (2013.01); *H01L 21/67069* (2013.01)

(58) Field of Classification Search
CPC .................................................. H01L 21/67242
See application file for complete search history.

(56) References Cited

U.S. PATENT DOCUMENTS

| | | | |
|---|---|---|---|
| 7,233,878 B2* | 6/2007 | Mitrovic | G01B 11/0683 |
| | | | 250/559.27 |
| 10,177,018 B2* | 1/2019 | Chiang | H01L 21/67253 |
| 2004/0125360 A1* | 7/2004 | Ludviksson | G01N 21/645 |
| | | | 356/72 |
| 2016/0216185 A1* | 7/2016 | Gottscho | H01J 37/32935 |

* cited by examiner

*Primary Examiner* — Leslie J Evanisko
*Assistant Examiner* — Leo T Hinze
(74) *Attorney, Agent, or Firm* — Duane Morris LLP (57) ABSTRACT

An apparatus for inspecting a wafer process chamber is disclosed. In one example, the apparatus includes: a sensor, a processor, and a lifetime predictor. The sensor captures information about at least one hardware part of the wafer process chamber. The processor processes the information to determine a hardware condition of the at least one hardware part. The lifetime predictor predicts an expected lifetime left for the at least one hardware part based on the hardware condition.

15 Claims, 9 Drawing Sheets

APPARATUS AND METHOD FOR INSPECTING A WAFER PROCESS CHAMBER

CROSS-REFERENCE TO RELATED APPLICATION

The present application claims priority to U.S. Provisional Patent Application No. 62/591,472, filed on Nov. 28, 2017, which is incorporated by reference herein in its entirety.

BACKGROUND

Various process chambers are used during the manufacture of devices on semiconductor wafers. The thermal processing of semiconductor wafers, for example, involves processes such as deposition, etching, heat treating, annealing, diffusion, and so forth, all of which are performed in process chambers. Some processes such as etching and chemical vapor deposition are performed in process chambers under low pressure or vacuum conditions.

A wafer process chamber includes many hardware parts that are exposed to heating, etching, and/or chemical reactions during and after the wafer processing performed in the wafer process chamber. After repeated use during the manufacture of semiconductor devices, a wafer process chamber may have an erosion on one part, a damage on another part, and/or a consumption on another part. A part of a wafer process chamber can also be consumed or damaged during cleaning of the wafer process chamber.

A wafer process chamber having consumed or damaged parts, when continuously being used during the wafer manufacturing process, will increase the wafer scrap rate and cause a low yield on the wafer manufacturing. As such, it is desirable to examine or inspect the wafer process chamber from time to time to ensure its hardware quality and prevent equipment breakdown. An existing method for inspecting wafer process chambers includes a preventive maintenance (PM) check by naked eye, which increases human labor and can hardly detect an accurate failure signal of a chamber part during the wafer process. Existing tool or method for inspecting a wafer process chamber falls short in solving the above deficiencies.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout the specification and drawings.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts. In the present disclosure, the terms "chamber part," "chamber hardware part," and "hardware part of a chamber" may be interchangeably used.

A wafer process chamber includes many hardware parts that are exposed to heating, etching, and/or chemical reactions during and after the wafer processing performed in the wafer process chamber. After being used for some time in the manufacture of semiconductor devices, a wafer process chamber may have consumed or damaged parts, which will increase the wafer scrap rate and cause a low yield on the wafer manufacturing. As such, it is desirable to inspect the wafer process chamber from time to time to ensure its hardware quality and prevent equipment breakdown.

To timely and accurately detect defects of a chamber part, the present disclosure introduces apparatus and methods for automatically and systematically inspecting a wafer process chamber and proactively predicting an expected lifetime left for a hardware part of the wafer process chamber. In one embodiment, the apparatus is a three-dimensional optical scanner that includes a sensor for capturing information about the chamber part. The information may constitute an image, a profile, or a condition parameter of the chamber part. Based on the information, the optical scanner can determine a hardware condition of the chamber part. A predetermined condition requirement can indicate whether the chamber part is effective with the current hardware condition. By comparing the hardware condition with a predetermined condition requirement, the optical scanner can predict an expected lifetime left for the chamber part. For example, if a chamber part has a minimum thickness requirement of 2 mm and it has been consumed from 6 mm to 5 mm in one week, then the chamber part will have an expected lifetime of 3 weeks. That is, the chamber part is expected to be repaired or replaced within 3 weeks to prevent chamber breakdown and wafer yield drop.

In one embodiment, the apparatus includes a reporter to report the expected lifetime of the chamber part for determining whether the wafer process chamber can continue to process wafers. The condition requirement for each hardware condition of the chamber part may be predetermined and updated based on an input from an administrator, a newly expected lifetime related to the hardware condition, and/or a new recipe for wafer process. A hardware condition may include information related to hardware erosion value, hardware dimension variation, and hardware damage location, etc.

The sensor may be coupled to the wafer process chamber, according to various embodiments. The sensor may be installed via a jig on or in the wafer process chamber, or through a gate valve of the wafer process chamber. The sensor may capture images or profiles of the chamber part periodically, such that the hardware condition of the wafer process chamber is monitored during and/or after the wafer processing. The sensor may utilize: a laser, a light-emitting diode (LED), an infrared, a visible light, an invisible light, a microwave, an X-ray, or a Gamma ray.

The present disclosure is applicable to an automatic inspection on all kinds of wafer process chambers. The disclosed apparatus can inspect and monitor hardware quality of a chamber to ensure the chamber working effectively under hardware condition requirements. The inspection may be performed automatically before a wafer process, to reduce the possibility of wafer scrap or yield loss due to consumption or damage of a chamber part, which can help to save time, cost, and labor in the wafer production chain. The disclosed apparatus and method for inspecting chamber parts can help a wafer manufacturer to optimize its semiconductor wafer production flow and build a better production plan, with an accurate and predictable lifetime of each chamber part of the wafer process chambers.

Figure 1:
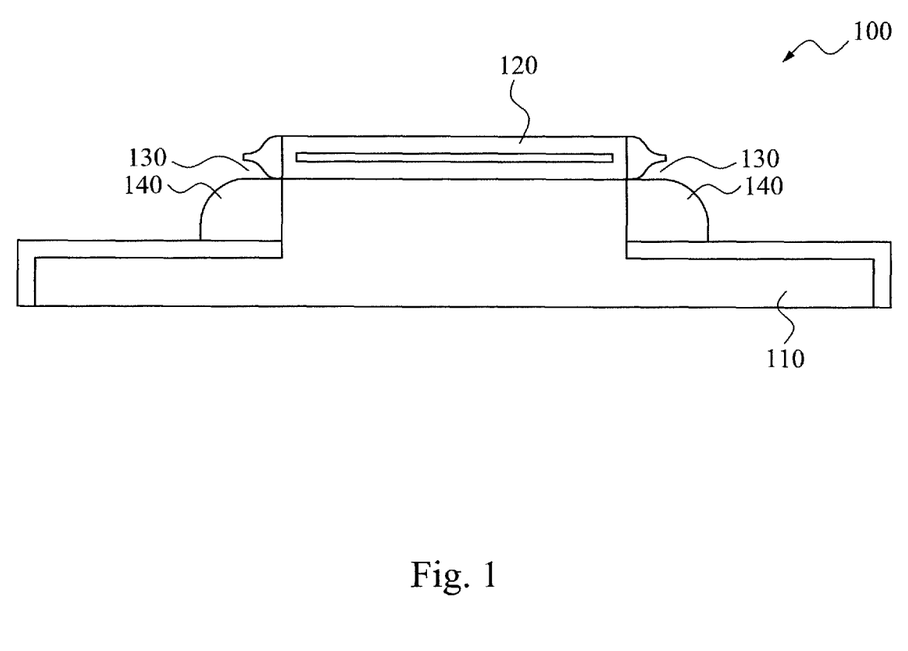
FIG. 1 illustrates an exemplary profile of a consumed chamber part, in accordance with some embodiments of the present disclosure.

FIG. 1 illustrates an exemplary profile of a consumed chamber part 100, in accordance with some embodiments of the present disclosure. As shown in FIG. 1, the chamber part 100 includes a base material 110 and a support 120. The support 120 is on top of the base material 110 to support a wafer when the wafer is placed thereon for processing. An outside material 140 is around the base material 110 and the support 120 for protection. After wafers are processed and chemical reactions are performed on and around the chamber part 100, as shown in FIG. 1, the chamber part 100 is consumed and has erosion 130 on the outside material 140. In one embodiment, once the erosion 130 reaches the base material 110, wafers being processed on the support 120 may have damages to cause wafer scrap and low yield. In addition, the chamber part 100 itself may be so damaged that it cannot be repaired after the base material 110 is eroded. The consumptions and damages like the erosion 130 need to be monitored and reported for hardware quality control of wafer process chambers.

Figure 2:
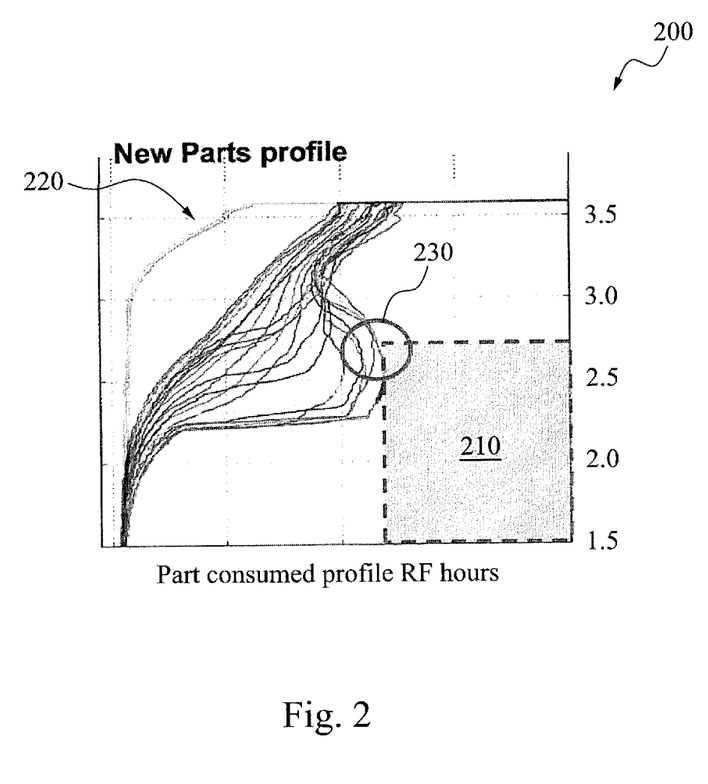
FIG. 2 illustrates an exemplary profile change of a chamber part with time, in accordance with some embodiments of the present disclosure.

FIG. 2 illustrates an exemplary profile change 200 of a chamber part with time, in accordance with some embodiments of the present disclosure. As shown in FIG. 2, the chamber part includes an aluminum base 210 and has a profile that changes with time. With reference to a new part profile 220 shown in FIG. 2, the chamber part becomes eroded and its profile changes as time goes by. In one embodiment, the profile erosion and damage are caused by wafer arcing, which is a plasma damage phenomenon during wafer etching operations. In this case, the consumed profile may be recorded with radio frequency (RF) hours of the etching. As shown in FIG. 2, the chamber part eventually becomes so eroded that its profile reaches its aluminum base 210 to make the aluminum base 210 exposed through the erosion 230. The disclosed apparatus, as described in detail below, can proactively predict when the erosion 230 will happen to expose the aluminum base 210, e.g. by calculating an expected lifetime left for the chamber part.

Figure 3:
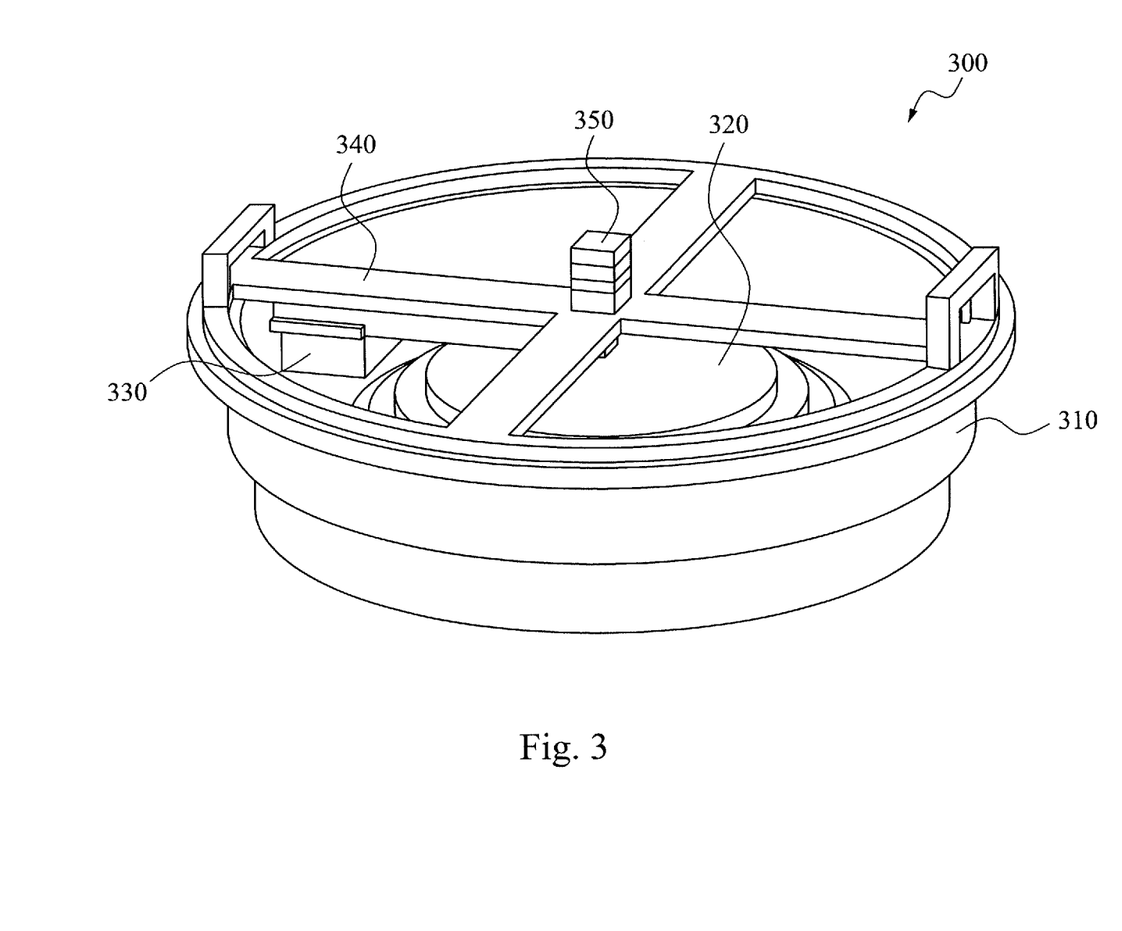
FIG. 3 illustrates an exemplary wafer process chamber having an optical scanner installed thereon, in accordance with some embodiments of the present disclosure.

FIG. 3 illustrates an exemplary wafer process chamber 300 having an optical scanner 330 installed thereon, in accordance with some embodiments of the present disclosure. As shown in FIG. 3, the wafer process chamber 300 in this example includes a housing 310, a support 320, and a mechanical arm 340. The support 320 is inside the housing and configured to support a wafer (not shown) when the wafer is placed thereon and processed inside the housing 310.

As shown in FIG. 3, the mechanical arm 340 in this example is on top of the housing 310. The optical scanner 330 is coupled to the mechanical arm 340 on top of the wafer process chamber 300. The wafer process chamber 300 also includes a motor (or an actuator) 350 on the mechanical arm 340 to enable the mechanical arm 340 rotate about an axis that is perpendicular to the support 320, such that the optical scanner 330 can also rotate about the axis to capture images or profiles of various chamber parts of the wafer process chamber 300 before or during wafer processing. The optical scanner 330 may include a sensor for capturing the images or profiles, and other components that can process the images or profiles and predict an expected lifetime for each inspected chamber part. In one embodiment, while the sensor is coupled to the mechanical arm 340 on top of the wafer process chamber 300, the other components of the optical scanner 330 may be electrically connected to the sensor and located at other locations of the wafer process chamber 300.

Figure 4:
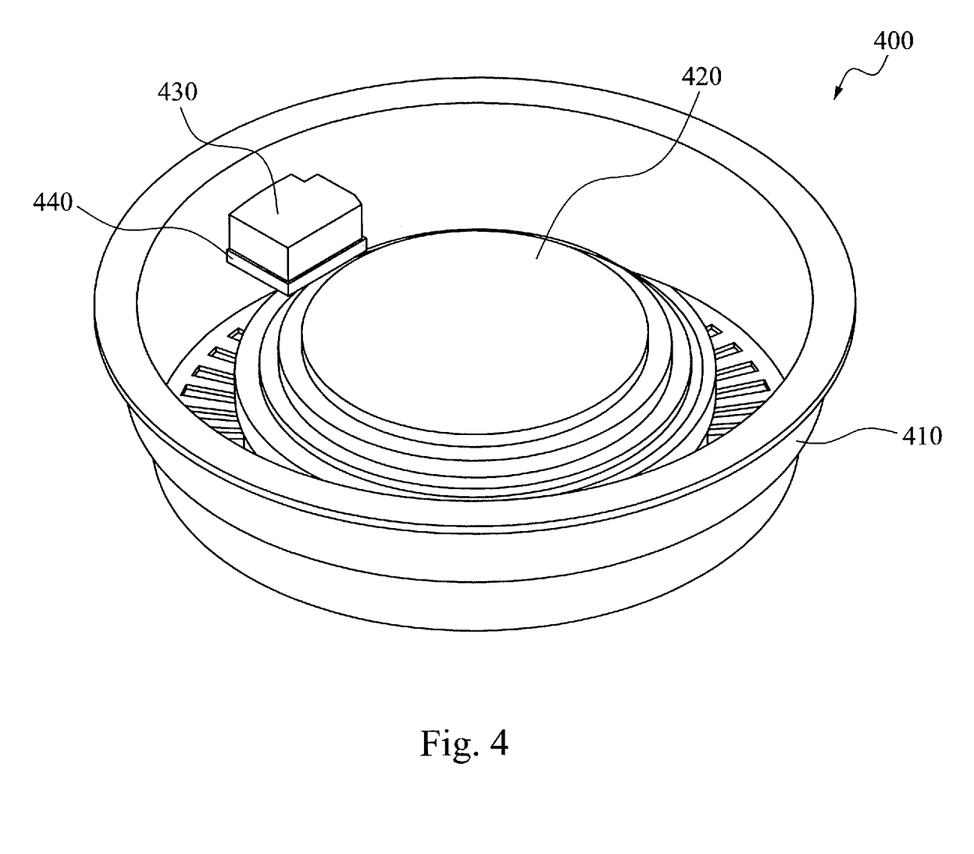
FIG. 4 illustrates another exemplary wafer process chamber having an optical scanner installed thereon, in accordance with some embodiments of the present disclosure.

FIG. 4 illustrates another exemplary wafer process chamber 400 having an optical scanner 430 installed thereon, in accordance with some embodiments of the present disclosure. As shown in FIG. 4, the wafer process chamber 400 in this example includes a housing 410, a support 420, and a shelf 440. The support 420 is inside the housing and configured to support a wafer (not shown) when the wafer is placed thereon and processed inside the housing 410.

As shown in FIG. 4, the shelf 440 in this example is coupled to an inside wall of the housing 410. The optical scanner 430 is fixed on the shelf 440, such that the optical scanner 430 is inside and coupled to the housing 410 as well. In this example, the support 420 can rotate about an axis that is perpendicular to the support 420 when the optical scanner 430 is fixed to the housing 410. As such, the optical scanner 430 can capture images or profiles of various chamber parts of the wafer process chamber 400 before or during wafer processing. The optical scanner 430 may include a sensor for capturing the images or profiles, and other components that can process the images or profiles and predict an expected lifetime for each inspected chamber part. In one embodiment, while the sensor is fixed on an inside wall of the housing 410, the other components of the optical scanner 430 may be electrically connected to the sensor and located at other locations of the wafer process chamber 400.

Figure 5:
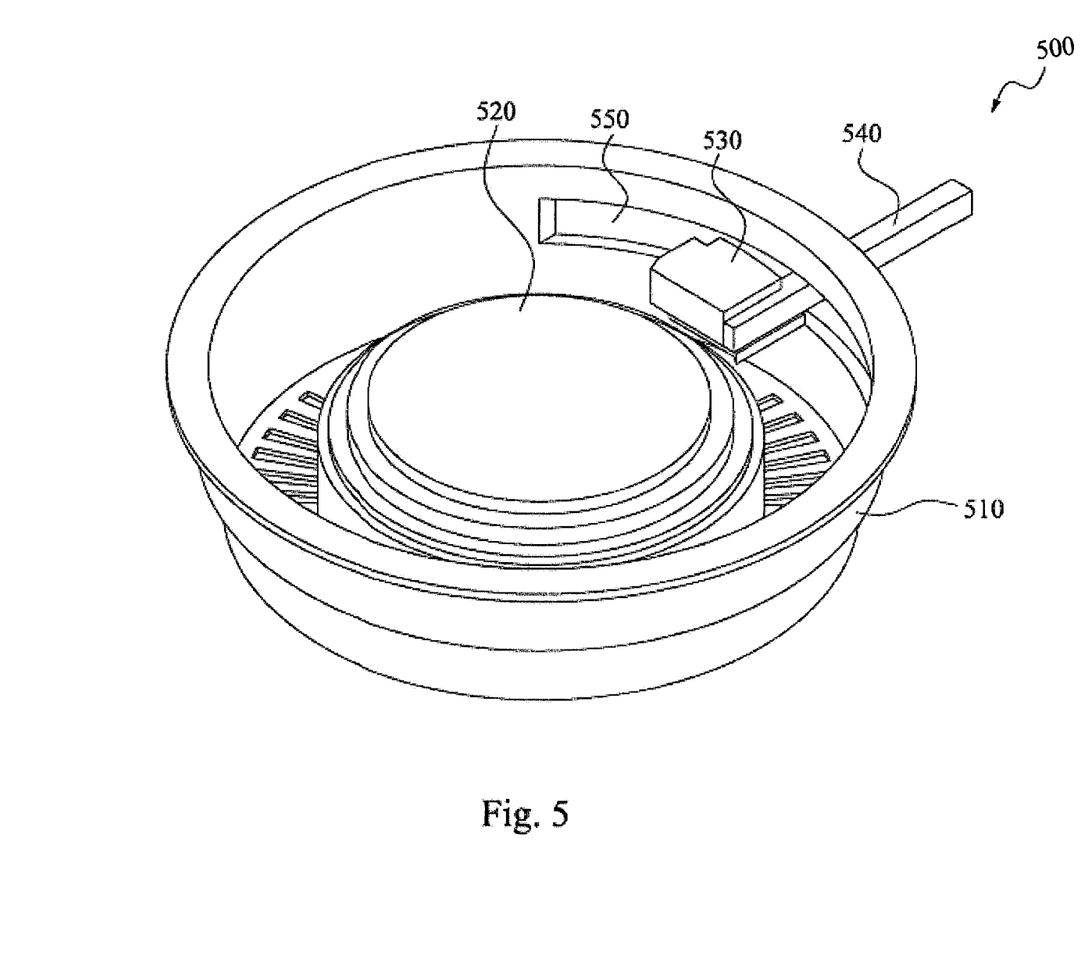
FIG. 5 illustrates yet another exemplary wafer process chamber having an optical scanner installed thereon, in accordance with some embodiments of the present disclosure.

FIG. 5 illustrates yet another exemplary wafer process chamber 500 having an optical scanner 530 installed thereon; in accordance with some embodiments of the present disclosure. As shown in FIG. 5, the wafer process chamber 500 in this example includes a housing 510 and a support 520. The support 520 is inside the housing and configured to support a wafer (not shown) when the wafer is placed thereon and processed inside the housing 510.

As shown in FIG. 5, the housing 510 has an opening 550 on a side of the housing 510. The optical scanner 530 in this example is coupled to a mechanical arm 540 that can extend through the opening 550. In this example, the support 520 can rotate about an axis that is perpendicular to the support 520 when the optical scanner 530 is fixed to the mechanical arm 540. As such, when the mechanical arm 540 extends through the opening 550, the optical scanner 530 fixed on the mechanical arm 540 can capture images or profiles of various chamber parts of the wafer process chamber 500 before or during wafer processing. The optical scanner 530 may include a sensor for capturing the images or profiles, and other components that can process the images or profiles and predict an expected lifetime for each inspected chamber part. In one embodiment, while the sensor is fixed on the mechanical arm 540, the other components of the optical scanner 530 may be electrically connected to the sensor and located at other locations. The opening 550 may be a gate valve such that it can be opened for the mechanical arm 540 to extend through to perform chamber part inspection by the optical scanner 530 before wafer processing, and closed for wafer processing in the housing 510 while the optical scanner 530 and the mechanical atm 540 rest outside the housing 510.

Figure 6:
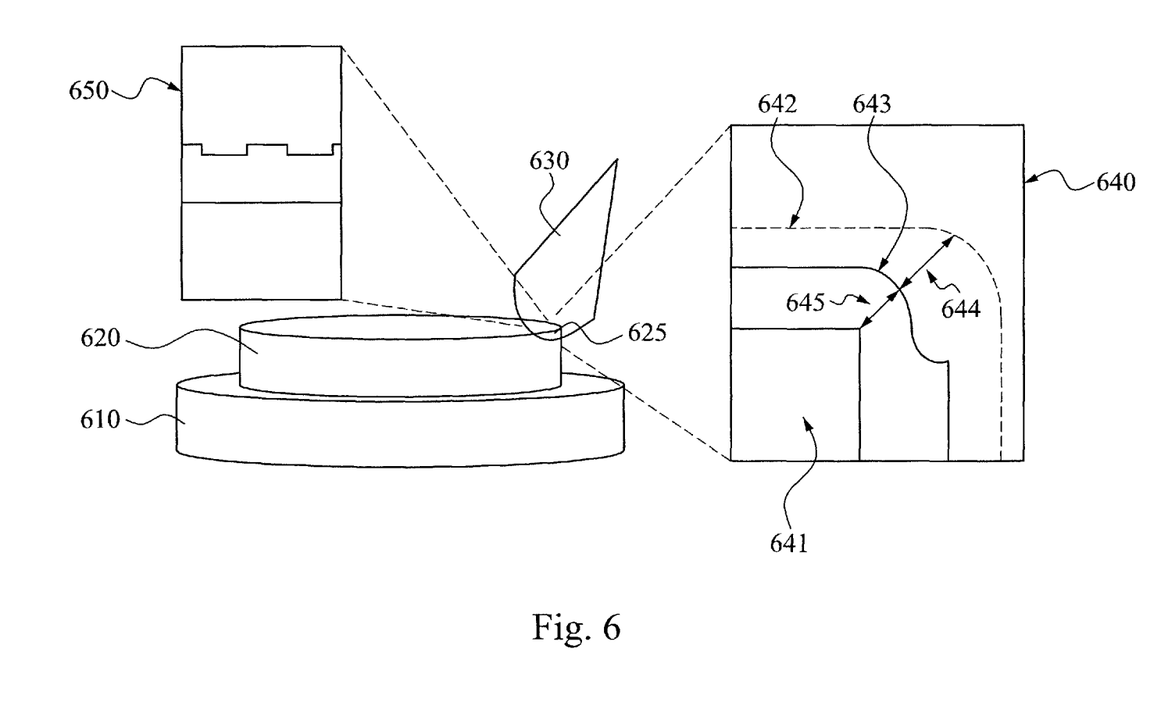
FIG. 6 illustrates information about a chamber part captured by an optical sensor on an optical scanner, in accordance with some embodiments of the present disclosure.

FIG. 6 illustrates various types of information about a chamber part captured by an optical sensor 630 on an optical scanner, in accordance with some embodiments of the present disclosure. As shown in FIG. 6, the chamber part includes a base 610 and a support 620. The optical sensor 630 can capture various information of the chamber part during inspection.

In one embodiment, the optical sensor 630 can capture a profile image 640 of the chamber part. As shown in FIG. 6, the profile image 640 illustrates a used part profile 643 of the chamber part. With reference to a new part profile 642, a part variation 644 can be determined by the optical scanner. In addition, the optical scanner can calculate an expected lifetime left for the chamber part, based on a distance 645 between the current used part profile 643 and the base material 641.

In another embodiment, the optical sensor 630 can capture information 650 about part variation and damage location on the chamber part. The information 650 may indicate a dimension variation of the chamber part and a location 625 of the damage detected by the optical scanner. The optical scanner may predict an expected lifetime left for a chamber part based on one or more hardware conditions, like a profile change, a dimension variation, a damage location, an erosion value, etc.

Figure 7:
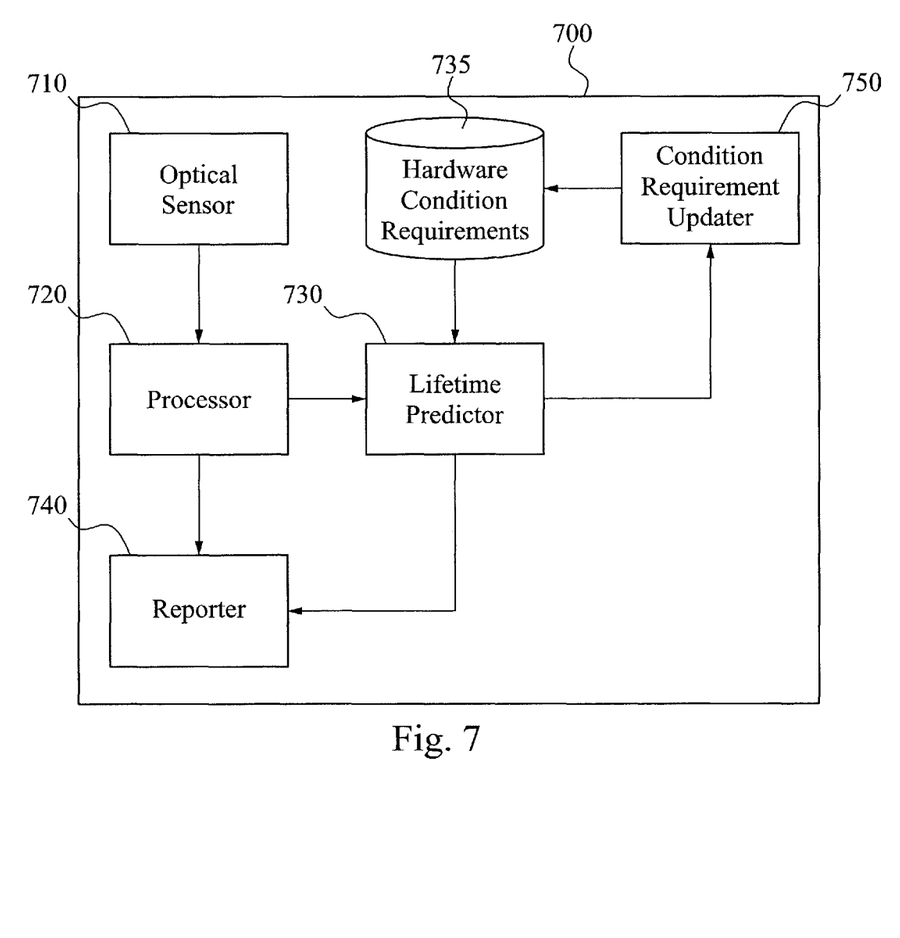
FIG. 7 illustrates an exemplary diagram of an optical scanner, in accordance with some embodiments of the present disclosure.

FIG. 7 illustrates an exemplary diagram of an optical scanner 700, in accordance with some embodiments of the present disclosure. As shown in FIG. 7, the optical scanner 700 in this example includes an optical sensor 710, a processor 720, a lifetime predictor 730, a report 740, and a condition requirement updater 750. The optical scanner 700 may inspect a wafer process chamber periodically, e.g. every hour, before or during a manufacturing process of wafers in the wafer process chamber.

During the inspection, the optical sensor 710 in this example can capture information about a hardware part of the wafer process chamber. According to various embodiments, the information may constitute an image, a profile, or a condition parameter of the chamber part. As discussed before, the optical sensor 710 may be coupled to the wafer process chamber, e.g. installed via a jig (a mechanical arm or a shelf) on or in the wafer process chamber, or through a gate valve of the wafer process chamber. The optical sensor 710 may capture images or profiles of the chamber part either periodically according to a clock or upon request from an administrator. According to various embodiments, the optical sensor 710 may utilize: a laser, an LED, an infrared, a visible light, an invisible light, a microwave, an X-ray, or a Gamma ray, for capturing the information. The optical sensor 710 can send the captured information, in form of an image, a profile, or one or more parameters, to the processor 720 for processing.

The processor 720 in this example receives the captured information from the optical sensor 710 and processes the information to determine a hardware condition of the chamber part. According to various embodiments, the hardware condition may include information related to: a degree of erosion of the at least one hardware part; a variation of a dimension of the at least one hardware part; and/or a damage location on the at least one hardware part. The processor 720 can send the hardware condition to the lifetime predictor 730 for lifetime prediction and to the report 740 for condition reporting.

The lifetime predictor 730 in this example can receive the hardware condition from the processor 720, and retrieve a condition requirement corresponding to the hardware condition from a database 735 that stores various hardware condition requirements related to a wafer process chamber. The condition requirement can indicate whether the chamber part is effective with the current determined hardware condition. The lifetime predictor 730 may compare the determined hardware condition with the condition requirement to generate a comparison result, and predict an expected lifetime left for the chamber part based on the comparison result. In one embodiment, the lifetime predictor 730 can save or record the hardware conditions of a same chamber part along with time. The lifetime predictor 730 can utilize the recorded information to predict the expected lifetime left for the chamber part.

In one example, a condition requirement indicates that the chamber part has a minimum profile thickness requirement of 2 mm. The processor 720 has determined that the chamber part has a current profile thickness of 5 mm. Based on recorded historical thicknesses of the chamber part, the lifetime predictor 730 can determine that the thickness of the chamber part has changed from 6 mm to 5 mm in one week. Then the lifetime predictor 730 can predict that the chamber part will become thinner by 1 mm every week, and therefore have an expected lifetime of 3 weeks before reaching the 2 mm limit. As such, the chamber part is expected to be repaired or replaced within 3 weeks to prevent chamber breakdown and wafer yield drop. The lifetime predictor 730 can send the expected lifetime of a chamber part to the report 740 for reporting and to the condition requirement updater 750 for condition requirement update.

The report 740 in this example can receive the expected lifetime of the chamber part from the lifetime predictor 730 and generate a report based on the expected lifetime. In one embodiment, the report 740 also receives the hardware conditions determined by the processor 720 and generate the report based on the hardware conditions as well. For example, the report will include information about damage degrees and damage locations of the chamber part, such that the report can be used for maintaining and repairing the chamber part.

The report 740 can send the report to an administrator or a control center of the wafer process chambers, for determining whether the wafer process chamber can continue to process wafers or not. The control center (not shown) may implement an algorithm to automatically determine whether to stop the wafer process chamber from running and send it for maintenance or repair. In one example, when the expected lifetime is less than a threshold, e.g. a day, the wafer process chamber may be stopped and sent for maintenance. In another example, when the expected lifetime is already reached or passed, the wafer process chamber may be stopped and sent for repair or replacement. In yet another example, when the expected lifetime is above the threshold but the relevant hardware condition is severe, the wafer process chamber may be stopped and sent for a safety check.

A condition requirement for each hardware condition of the chamber part may be predetermined and updated by the condition requirement updater 750. The condition requirement updater 750 in this example can update the condition requirements 735 based on an input from an administrator, a newly expected lifetime received from the lifetime predictor 730, and/or a new recipe for wafer process. The input from the administrator may be related to the algorithm implemented at the control center as described above. A new recipe for processing wafers may indicate new types of chemical reactions, which may mean new degrees of erosion rate and new types of damages on the chamber part, which may in turn mean a new desirable hardware condition requirement for the chamber part.

In one embodiment, every time after processing a predetermined number of wafers, the wafer process chamber is inspected by the optical scanner 700. The optical scanner 700 collects the hardware conditions and records the profile curves of different chamber parts. Based on the collected historical hardware conditions and recorded historical profile curves, the condition requirement updater 750 can determine or update the hardware condition requirements 735.

In one embodiment, the optical scanner 700 is a three-dimensional optical scanner that can capture a curved profile or surface of a chamber part. The optical scanner 700 may be installed on a wafer process chamber according to different manners as illustrated in FIGS. 3-5. In one embodiment, the optical scanner 700 is installed in such a manner that it focuses on scanning one or more specific chamber parts or towards one or more specific directions in the wafer process chamber.

In one embodiment, the optical scanner 700 performs inspection of a wafer process chamber before wafers enter the chamber. If the inspection results in a report that the hardware conditions of the chamber parts are good or satisfy predetermined criteria, the wafers are allowed to enter the chamber. If the inspection results in a report that the hardware conditions of the chamber parts do not satisfy the predetermined criteria, the wafers are not allowed to enter the chamber, and the chamber will be sent for maintenance, repair, or replacement.

Figure 8:
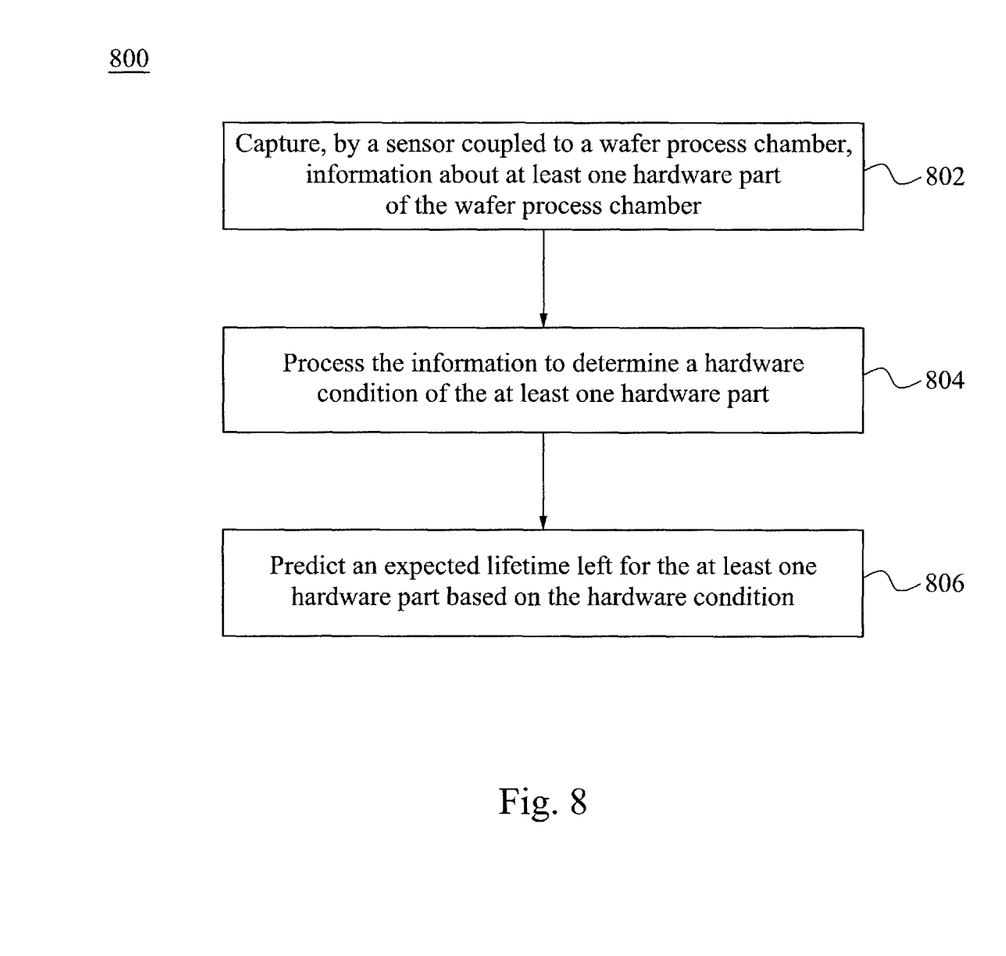
FIG. 8 is a flow chart illustrating an exemplary method for inspecting a wafer process chamber, in accordance with some embodiments of the present disclosure.

FIG. 8 is a flow chart illustrating an exemplary method 800 for inspecting a wafer process chamber, in accordance with some embodiments of the present disclosure. At operation 802, a sensor coupled to the wafer process chamber captures information about at least one hardware part of the wafer process chamber. The information is processed at operation 804 to determine a hardware condition of the at least one hardware part. An expected lifetime left for the at least one hardware part is predicted at operation 806 based on the hardware condition.

Figure 9:
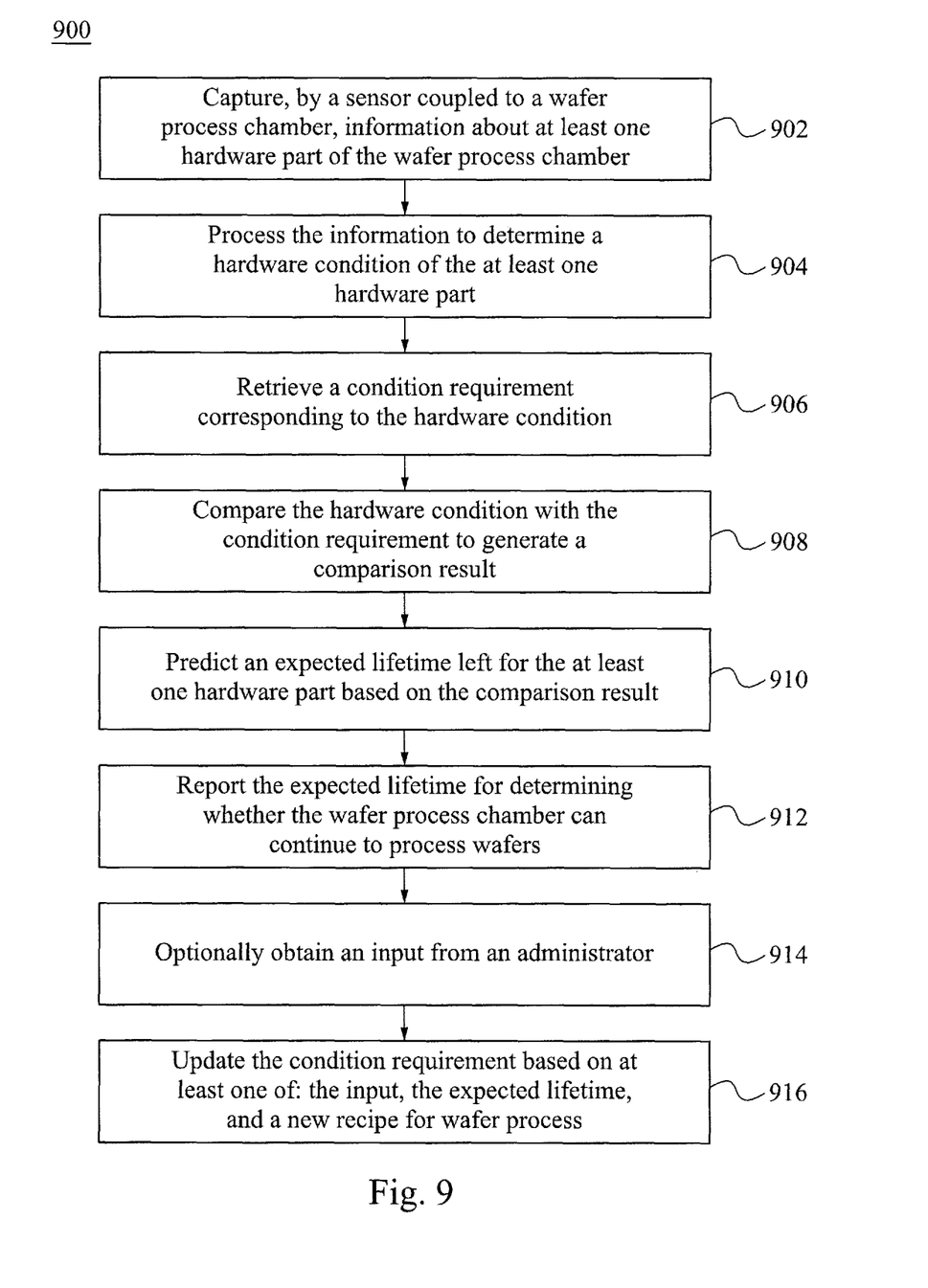
FIG. 9 is a flow chart illustrating another exemplary method for inspecting a wafer process chamber, in accordance with some embodiments of the present disclosure.

FIG. 9 is a flow chart illustrating another exemplary method 900 for inspecting a wafer process chamber, in accordance with some embodiments of the present disclosure. At operation 902, a sensor coupled to the wafer process chamber captures information about at least one hardware part of the wafer process chamber. The information is processed at operation 904 to determine a hardware condition of the at least one hardware part. A condition requirement is retrieved at operation 906 corresponding to the hardware condition. The hardware condition is compared at operation 908 with the condition requirement to generate a comparison result. An expected lifetime left for the at least one hardware part is predicted at operation 910 based on the comparison result. The expected lifetime is reported at operation 912 for determining whether the wafer process chamber can continue to process wafers. Optionally at operation 914, an input from an administrator is obtained. At operation 916, the condition requirement is updated based on at least one of: the input, the expected lifetime, and a new recipe for wafer process. It can be understood that the order of the steps shown in each of FIG. 8 and FIG. 9 may be changed according to different embodiments of the present disclosure.

In an embodiment, an apparatus for inspecting a wafer process chamber is disclosed. The apparatus includes: a sensor, a processor, and a lifetime predictor. The sensor captures information about at least one hardware part of the wafer process chamber. The processor processes the information to determine a hardware condition of the at least one hardware part. The lifetime predictor predicts an expected lifetime left for the at least one hardware part based on the hardware condition.

In another embodiment, a wafer process chamber is disclosed. The wafer process chamber includes: a housing, a support, and an optical scanner. The support is inside the housing and configured to support a wafer, when the wafer is placed on the support and processed inside the housing. The optical scanner is coupled to the housing and configured to inspect at least one hardware part of the wafer process chamber.

In yet another embodiment, a method for inspecting a wafer process chamber is disclosed. The method includes: capturing, by a sensor coupled to the wafer process chamber, information about at least one hardware part of the wafer process chamber; processing the information to determine a hardware condition of the at least one hardware part; and predicting an expected lifetime left for the at least one hardware part based on the hardware condition.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for inspecting a wafer process chamber, comprising:
   a sensor coupled to a mechanical arm on top of a housing of the wafer process chamber, wherein
     the sensor is configured to capture information about a support inside the housing,
     the support is configured to support a wafer when the wafer is placed thereon, and
     the mechanical arm carrying the sensor is configured to rotate around an axis that is perpendicular to the support;
   a processor configured to process the information to determine a hardware condition of the support; and
   a lifetime predictor configured to predict an expected lifetime left for the support based on the hardware condition.

2. The apparatus of claim 1, further comprising:
   a reporter configured to report the expected lifetime of the support for determining whether the wafer process chamber can continue to process wafers.

3. The apparatus of claim 1, wherein the lifetime predictor is further configured to:
   retrieve a condition requirement corresponding to the hardware condition; and
   compare the hardware condition with the condition requirement to generate a comparison result, wherein the expected lifetime is predicted based on the comparison result.

4. The apparatus of claim 3, further comprising a condition requirement updater configured to update the condition requirement based on at least one of: an input from an administrator, the expected lifetime, and a new recipe for wafer process.

5. The apparatus of claim 1, wherein the hardware condition includes information related to at least one of:
   a degree of erosion of the support;
   a variation of a dimension of the support; and
   a damage location on the support.

6. The apparatus of claim 1, wherein the sensor is configured to capture the information about the support periodically during a manufacturing process of wafers in the wafer process chamber.

7. The apparatus of claim 1, wherein:
   the apparatus is a three-dimensional optical scanner that utilizes at least one of: a laser, a light-emitting diode (LED), an infrared, a visible light, an invisible light, a microwave, an X-ray, and a Gamma ray; and
   the information captured by the sensor constitutes at least one of: an image of the support, a profile of the support, and at least one parameter related to the hardware condition of the support.

8. A wafer process chamber comprising:
   a housing;
   a support that is inside the housing and configured to support a wafer, when the wafer is placed on the support and processed inside the housing; and
   an optical scanner that is coupled to the housing and configured to inspect the support, wherein
     the optical scanner comprises a sensor coupled to a mechanical arm on top of the housing and configured to capture information about the support, and
     the mechanical arm carrying the sensor is configured to rotate around an axis that is perpendicular to the support.

9. The wafer process chamber of claim 8, wherein the optical scanner further comprises:
   a processor configured to process the information to determine a hardware condition of the support; and
   a lifetime predictor configured to predict an expected lifetime left for the support based on the hardware condition.

10. The wafer process chamber of claim 9, wherein the optical scanner further comprises:
    a reporter configured to report the expected lifetime of the support for determining whether the wafer process chamber can continue to process wafers.

11. The wafer process chamber of claim 9, wherein the lifetime predictor is further configured to:
    retrieve a condition requirement corresponding to the hardware condition; and
    compare the hardware condition with the condition requirement to generate a comparison result, wherein the expected lifetime is predicted based on the comparison result.

12. The wafer process chamber of claim 9, wherein the hardware condition includes information related to at least one of:
    a degree of erosion of the support;
    a variation of a dimension of the support; and
    a damage location on the support.

13. The wafer process chamber of claim 9, wherein:
    the optical scanner is a three-dimensional optical scanner that utilizes at least one of: a laser, an LED, an infrared, a visible light, an invisible light, a microwave, an X-ray, and a Gamma ray; and
    the information captured by the sensor constitutes at least one of: an image of the support, a profile of the support, and at least one parameter related to the hardware condition of the support.

14. The wafer process chamber of claim 8, wherein:
    the support is further configured to rotate about an axis that is perpendicular to the support when the sensor is fixed to the mechanical arm.

15. A method for inspecting a wafer process chamber, comprising:

capturing, by a sensor coupled to a mechanical arm on top of a housing of the wafer process chamber, information about a support inside the wafer process chamber and configured to support a wafer when the wafer is placed thereon,
wherein the information is captured by the sensor while the mechanical arm carrying the sensor rotates around an axis that is perpendicular to the support;
processing the information to determine a hardware condition of the support; and
predicting an expected lifetime left for the support based on the hardware condition.

\* \* \* \* \*